(12) United States Patent
Kobayashi et al.

(10) Patent No.: US 8,612,038 B2
(45) Date of Patent: Dec. 17, 2013

(54) TARGET OBJECT PROCESSING SYSTEM AND METHOD OF CONTROLLING THE SAME

(75) Inventors: Kenichi Kobayashi, Yamanashi (JP); Youichi Nakayama, Yamanashi (JP); Keiichiro Shiki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 205 days.

(21) Appl. No.: 12/822,558

(22) Filed: Jun. 24, 2010

(65) Prior Publication Data

US 2010/0292809 A1  Nov. 18, 2010

Related U.S. Application Data

(63) Continuation of application No. PCT/JP2008/073314, filed on Dec. 22, 2008.

(30) Foreign Application Priority Data

Dec. 26, 2007  (JP) .................................. 2007-333438

(51) Int. Cl.

| | | |
|---|---|---|
| G06F 19/00 | (2011.01) | |
| G05B 19/18 | (2006.01) | |
| G05B 15/02 | (2006.01) | |
| G05B 11/01 | (2006.01) | |
| C23C 16/00 | (2006.01) | |
| H01L 21/311 | (2006.01) | |
| H01L 21/461 | (2006.01) | |
| G06F 17/50 | (2006.01) | |

(52) U.S. Cl.
USPC ............. 700/96; 118/725; 438/694; 438/754; 716/54; 716/132; 700/3; 700/9; 700/20; 700/95

(58) Field of Classification Search
USPC .................. 700/95, 96, 20, 9, 3; 716/54, 132; 438/694, 758; 118/725
See application file for complete search history.

(56) References Cited

U.S. PATENT DOCUMENTS

| 4,124,887 | A | * | 11/1978 | Johnson et al. ................... 700/9 |
| 5,276,875 | A | * | 1/1994 | Satoh ............................. 399/76 |
| 5,398,336 | A | * | 3/1995 | Tantry et al. .......................... 1/1 |
| 5,462,397 | A | * | 10/1995 | Iwabuchi ...................... 414/217 |
| 5,591,269 | A | * | 1/1997 | Arami et al. ............... 118/723 R |

(Continued)

FOREIGN PATENT DOCUMENTS

| JP | 10-189488 | 7/1998 |
| JP | 2000260672 | 9/2000 |

(Continued)

OTHER PUBLICATIONS

International Search Report for PCT/JP2008/073314, dated Feb. 3, 2009, 4 pgs.

Primary Examiner — Kavita Padmanabhan
Assistant Examiner — Thomas Stevens
(74) Attorney, Agent, or Firm — Pearne & Gordon LLP

(57) ABSTRACT

A processing system for performing a predetermined process on a target object includes one or more processing apparatuses that process the target object and a controller that controls the processing apparatuses. Here, the controller performs a control to select any one of a shutdown state in which a multiple number of end devices of the processing apparatuses are all stopped and a standby state in which some or all of the end devices are ready to perform a process on the target object, when the controller is shut down.

7 Claims, 9 Drawing Sheets

(56) References Cited

U.S. PATENT DOCUMENTS

| | | | |
|---|---|---|---|
| 5,659,467 A * | 8/1997 | Vickers | 700/9 |
| 5,664,254 A * | 9/1997 | Ohkura et al. | 396/612 |
| 5,759,873 A * | 6/1998 | Kata et al. | 438/118 |
| 6,296,711 B1 * | 10/2001 | Loan et al. | 118/726 |
| 6,303,395 B1 * | 10/2001 | Nulman | 438/14 |
| 6,337,863 B1 * | 1/2002 | Nair et al. | 370/395.53 |
| 6,618,629 B2 * | 9/2003 | Martens et al. | 700/9 |
| 6,621,412 B1 * | 9/2003 | Markle et al. | 340/517 |
| 6,691,191 B1 * | 2/2004 | Kobayashi et al. | 710/107 |
| 6,725,402 B1 * | 4/2004 | Coss et al. | 714/48 |
| 6,857,093 B2 * | 2/2005 | Ooishi | 714/733 |
| 7,027,884 B2 * | 4/2006 | Watanabe et al. | 700/97 |
| 7,282,377 B2 * | 10/2007 | Muranaka | 438/18 |
| 7,472,387 B2 * | 12/2008 | Nakano | 717/174 |
| 7,617,403 B2 * | 11/2009 | Capps et al. | 713/300 |
| 8,019,929 B2 * | 9/2011 | Kimura | 711/103 |
| 2001/0027350 A1 * | 10/2001 | Koga et al. | 700/95 |
| 2001/0054387 A1 * | 12/2001 | Frankel et al. | 118/725 |
| 2002/0023329 A1 * | 2/2002 | Nulman | 29/25.01 |
| 2002/0076492 A1 * | 6/2002 | Loan et al. | 427/255.28 |
| 2002/0095233 A1 * | 7/2002 | Takeuchi | 700/121 |
| 2002/0111708 A1 | 8/2002 | Nakano | |
| 2002/0190742 A1 * | 12/2002 | Ooishi | 324/763 |
| 2003/0009311 A1 * | 1/2003 | Ushiku et al. | 702/184 |
| 2003/0049372 A1 * | 3/2003 | Cook et al. | 427/248.1 |
| 2003/0169291 A1 * | 9/2003 | Nakata et al. | 345/753 |
| 2004/0053429 A1 * | 3/2004 | Muranaka | 438/17 |
| 2004/0143418 A1 * | 7/2004 | Ushiku et al. | 702/184 |
| 2005/0197730 A1 * | 9/2005 | Hsu et al. | 700/121 |
| 2005/0209720 A1 * | 9/2005 | Ina et al. | 700/95 |
| 2006/0175553 A1 * | 8/2006 | Tomine | 250/397 |
| 2006/0207725 A1 * | 9/2006 | Oohashi et al. | 156/345.53 |
| 2007/0227448 A1 * | 10/2007 | Tomine | 118/695 |
| 2008/0188970 A1 * | 8/2008 | Huang et al. | 700/103 |
| 2009/0043413 A1 * | 2/2009 | Yano et al. | 700/95 |
| 2009/0260209 A1 * | 10/2009 | Ishibashi et al. | 29/407.02 |
| 2010/0144159 A1 * | 6/2010 | Takatsuki | 438/758 |
| 2011/0033956 A1 * | 2/2011 | Sakai | 438/5 |

FOREIGN PATENT DOCUMENTS

| | | | |
|---|---|---|---|
| JP | 2002-217182 | | 8/2002 |
| JP | 2004259088 | | 9/2004 |
| JP | 2008211004 A | * | 9/2008 |

* cited by examiner

TARGET OBJECT PROCESSING SYSTEM AND METHOD OF CONTROLLING THE SAME

CROSS-REFERENCE TO RELATED APPLICATION

This application is a Continuation of International Application No. PCT/JP2008/073314 filed on Dec. 22, 2008, which claims the benefits of Japanese Patent Application No. 2007-0333438 filed on Dec. 26, 2007. The entire disclosure of the prior application is incorporated herein by reference in its entirety.

FIELD OF THE INVENTION

The present invention relates to a target object processing system including a processing apparatus for performing a film forming process or an etching process on a target object such as a semiconductor wafer and a method of controlling the target object processing system.

BACKGROUND OF THE INVENTION

In manufacturing semiconductor device, various kinds of processes such as a film forming process or an etching process are repeatedly performed on a target object such as a semiconductor wafer. In order to perform these processes, there has been used a processing system including a plurality of processing apparatuses for performing different processes. Such a processing system is managed by a computer and a predetermined process is performed in each processing apparatus according to software executed by the computer.

Typically, in the respective processing apparatuses constituting the processing system, several preparatory processes are required to perform a next process. For example, in a CVD film forming apparatus for performing a film forming process on a target object by a CVD (Chemical Vapor Deposition) method, after a certain process is completed in a predetermined chamber and before the next process is started, a process of cleaning the inside of the predetermined chamber, a process of purging the inside of the chamber by introducing a non-reactive gas into the chamber, a process of preliminarily heating a susceptor for supporting the target object in the chamber, and a process of pre-coating the susceptor have been performed as preparatory processes (see, for example, Japanese Patent Laid-open Publication No. H10-189488 (FIG. 4)). Since it usually takes a long time of about half a day or one day to carry out a series of these preparatory processes, during that time period, it is impossible to perform a process on the target object in the processing apparatuses.

Meanwhile, software (program) installed in a hard disc of the computer for managing the processing system is frequently updated (version-up) to reflect a change in a process content. In the processing system for manufacturing a semiconductor, there may be performed a mirroring operation in which a pair of the same hard discs of the computer are prepared so as to simultaneously record therein the same contents for a backup. When the version-up of software is made in hard discs configured as stated above, one hard disc is disconnected and the version-up of software is made in the other hard disc, in order to make an easy recovery when the version-up fails. Then, operations are checked using the version-up software. Thereafter, the disconnected hard disc is reconnected with the computer and the version-up software is copied from the other hard disc into the one hard disc. In this case, in order to disconnect and reconnect the hard disc, it needs to turn off a power supply of the computer to shut the computer down.

As described above, since the whole processing system is unitarily managed by the computer, when the computer is shut down so as to perform the version-up of the software, the whole processing system needs to be stopped. That is, power supplies of end devices such as a pump, a heater, a high frequency power supply in each processing apparatus should be shut down. However, as for a semiconductor manufacturing apparatus for performing a precise process such as a film forming process or an etching process on a target object, if each end device is stopped once, the above-described preparatory processes are needed to be taken to recover the end device to an operable condition. Accordingly, non-operation time (downtime) of the whole processing system is increased, which causes a decrease in process efficiency.

BRIEF SUMMARY OF THE INVENTION

In view of the foregoing, the present invention is conceived to effectively solve the above-described problem. The present invention provides a processing system capable of minimizing preparation time required until a processing apparatus is restarted after a computer is shut down for a version-up of software, for example.

In accordance with one aspect of the present invention, there is provided a processing system for performing a predetermined process on a target object. The system includes: one or more processing apparatuses that process the target object; and a controller that controls the processing apparatuses. Here, the controller may perform a control to select any one of a shutdown state in which a multiple number of end devices of the processing apparatuses are all stopped and a standby state in which some or all of the end devices are ready to perform a process on the target object, when the controller is shut down.

In accordance with the present invention, since the controller performs a control to select any one of a system shutdown state in which a multiple number of end devices of the processing apparatuses are all stopped and a standby state in which some or all of the end devices are ready to perform a process to the target object when the controller is shut down, preparatory processes become unnecessary or such preparatory processes can be performed with high efficiency until the controller is started after the controller is shut down for a software version-up, for example.

Therefore, in accordance with the present invention, when, for example, the version-up of the software is made, downtime of the processing system can be greatly reduced and further, it is possible to save energy or reduce costs in the processing system.

Desirably, the controller may include an I/O information storage that stores I/O information on the end devices in the standby state.

Further, it is desirable that if the controller is restarted after the standby state is selected and the controller is shut down, the controller may refer to the I/O information stored in the I/O information storage and output the same I/O information as the referred I/O information to each of the end devices.

In this case, it is desirable that the I/O information may be assigned a unique management number.

In accordance with another aspect of the present invention, there is provided a processing system for performing a predetermined process on a target object. The processing system includes one or more processing apparatuses that process the target object; a plurality of first controllers, each being provided in each of the processing apparatuses to control each of the processing apparatuses; and a second controller that is connected to the plurality of first controllers to generally control the first controllers. Here, the second controller may perform a control to select any one of a shutdown state in which a multiple number of end devices of the processing apparatuses are all stopped and a standby state in which some or all of the end devices are ready to perform a process on the target object, when the second controller is shut down.

In accordance with the present invention, since the second controller performs a control to select any one of a system shutdown state in which a multiple number of end devices of the processing apparatuses are all stopped and a standby state in which some or all of the end devices are ready to perform a process to the target object when the second controller is shut down, preparatory processes become unnecessary or such preparatory processes can be performed with high efficiency until the second controller is started after the second controller is shut down for a software version-up, for example.

Therefore, in accordance with the present invention, when, for example, the version-up of the software is performed, downtime of the processing system can be greatly reduced and further, it is possible to save energy and reduce costs in the processing system.

Desirably, the first controller may include an I/O information storage that stores I/O information on the end devices in the standby state.

Further, it is desirable that if the second controller is restarted after the standby state is selected and the second controller is shut down, the second controller may load software onto the first controller, and the first controller may refer to the I/O information stored in the I/O information storage according to the software and output the same I/O information as the referred I/O information to each of the end devices.

In this case, it is desirable that the I/O information may be assigned a unique management number.

For example, the above-mentioned target object may be a semiconductor substrate.

By way of example, the predetermined process may be a film forming process.

Further, for example, the end devices may include a heating unit embedded in a mounting table for mounting thereon the target object.

In accordance with still another aspect of the present invention, there is provided a control method for controlling a processing system when the version-up of software executed by a controller is performed. The processing system performs a predetermined process on a target object and includes one or more processing apparatuses that process the target object and the controller that controls the processing apparatuses. Here, the controller may perform a control to select any one of a shutdown state in which a multiple number of end devices of the processing apparatuses are all stopped and a standby state in which some or all of the end devices are ready to perform a process on the target object when the controller is shut down. The control method includes storing I/O information on the end devices in the standby state in an I/O information storage connected to the controller; and referring to the I/O information on the end devices in the standby state which is stored in the I/O information storage, when the controller is restarted after the standby state is selected and the controller is shut down and then new software is installed in the controller.

Desirably, the control method may further include outputting the same I/O information as the referred I/O information to each of the end devices.

Further, it is desirable that the I/O information may be assigned a unique management number.

In this case, it is desirable that the management number may be commonly used in software before the version-up and new software after the version-up.

In accordance with still another aspect of the present invention, there is provided a software version-up method for upgrading software executed by a controller in a processing system performing a predetermined process on a target object and including one or more processing apparatuses that process the target object and the controller that controls the processing apparatuses. Here, the controller may perform a control to select any one of a shutdown state in which a multiple number of end devices of the processing apparatuses are all stopped and a standby state in which some or all of the end devices are ready to perform a process on the target object when the controller is shut down. The software version-up method includes storing I/O information on the end devices in the standby state in an I/O information storage connected to the controller; selecting the standby state and shutting the controller down; upgrading the software; and starting the controller. The start-up of the controller may include referring to the I/O information on the end devices in the standby state which is stored in the I/O information storage when the controller is started.

Desirably, the software version-up method may further include performing the same process as a previous process before the standby state in the processing apparatus based on the referred I/O information.

Further, it is desirable that the I/O information is assigned a unique management number.

Furthermore, it is desirable that the management number may be commonly used in software before the version-up and new software after the version-up.

DETAILED DESCRIPTION OF THE INVENTION

Figure 1:
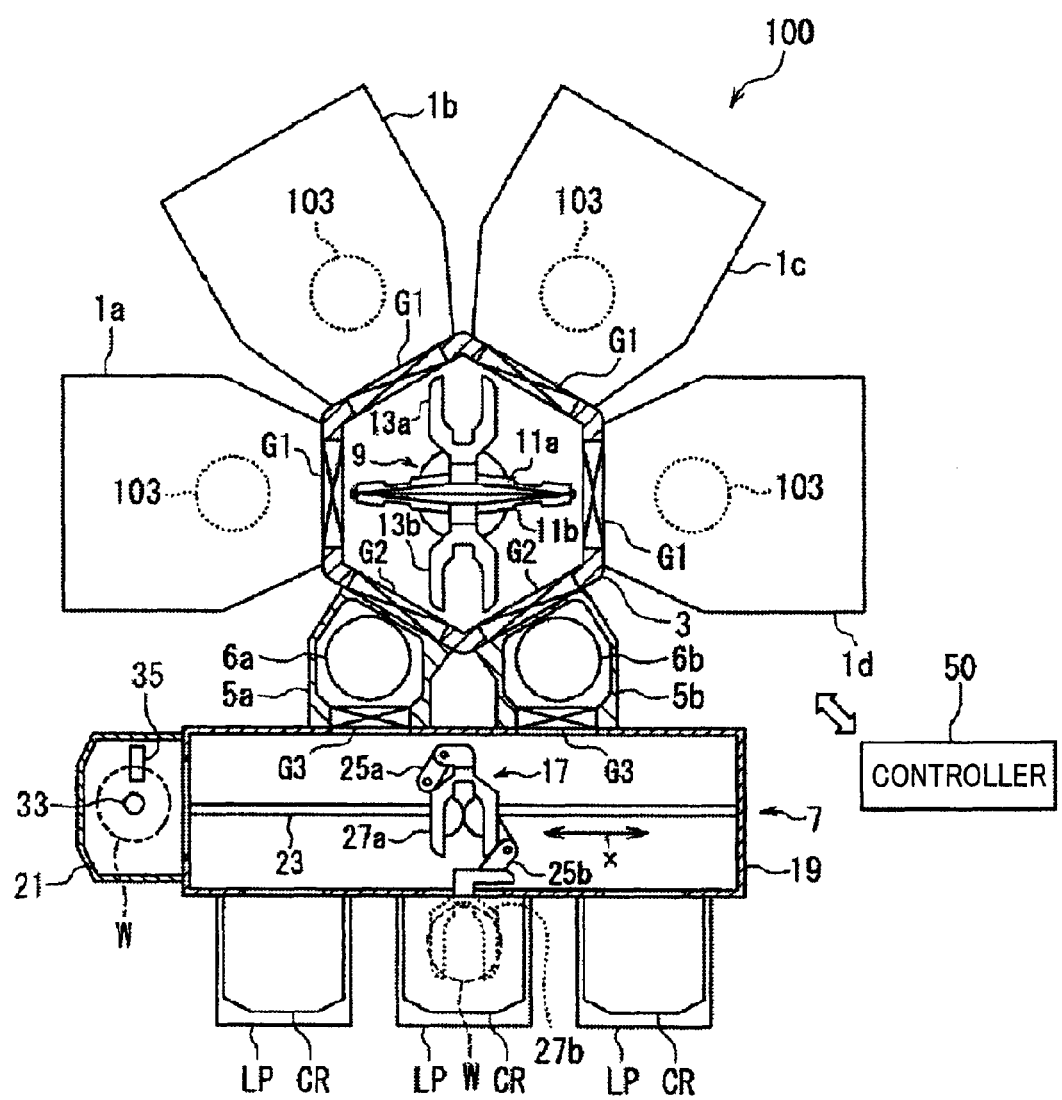
FIG. 1 shows a schematic configuration of a substrate processing system in accordance with an embodiment of the present invention.

Hereinafter, embodiments of the present invention will be described. First of all, a substrate processing system in accordance with an embodiment of the present invention will be explained with reference to FIG. 1. FIG. 1 shows a schematic configuration of a substrate processing system 100 configured to perform various kinds of processes such as a film forming process or an etching process on, e.g., a semiconductor wafer W (hereinafter, simply referred to as "wafer") as a substrate. This substrate processing system 100 is configured as a multi-chamber cluster tool.

The substrate processing system 100 includes four processing chambers 1a, 1b, 1c, and 1d configured to perform various kinds of processes on the wafer W; a vacuum transfer chamber 3 connected to each of these processing chambers 1a to 1d via each gate valve G1; two load lock chambers 5a and 5b each connected to the vacuum transfer chamber 3 via each gate valve G2; and a loader unit 7 connected to each of these two load lock chambers 5a and 5b via each gate valve G3.

The four processing chambers 1a to 1d perform, for example, a CVD process, a plasma etching process, a plasma ashing process, an oxidation process, a diffusion process, or a modification process on the wafer W. The processing chambers 1a to 1d may perform the same process or different processes on the wafer W.

Figure 2:
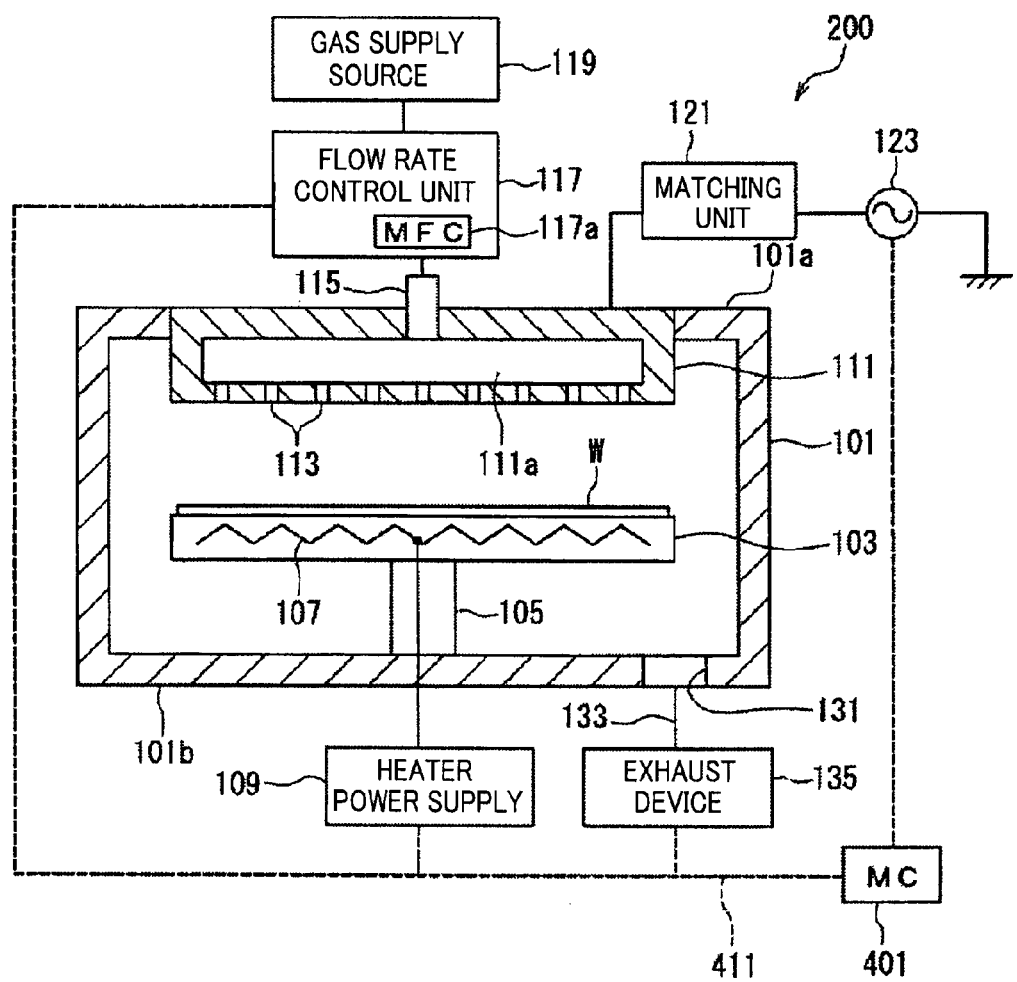
FIG. 2 is a cross sectional view of a schematic configuration of a film forming apparatus.

FIG. 2 shows a configuration of a film forming apparatus 200 as an example of the processing chambers 1a to 1d. This film forming apparatus 200 includes a substantially cylindrical processing chamber 101 which is airtightly sealed. Within the processing chamber 101, there is provided a susceptor 103 configured to horizontally support the wafer W as a target object. The susceptor 103 is supported by a cylindrical support member 105. Further, a heater 107 is embedded in the susceptor 103. The heater 107 is power-supplied from a heater power supply 109 and heats the wafer W to a certain temperature.

At a ceiling wall 101a of the processing chamber 101, a shower head 111 is installed. A gas diffusion space 111a is provided within the shower head 111. Further, a multiple number of gas discharge holes 113 communicating with the gas diffusion space 111a are formed in a lower surface of the shower head 111. Furthermore, a gas supply line 115 communicates with the gas diffusion space 111a at a central portion of the shower head 111. The gas supply line 115 is connected to a gas supply source 119 that supplies a film forming source gas or the like via a flow rate control unit 117. The flow rate control unit 117 includes an MFC (mass flow controller) 117a and a non-illustrated valve.

In addition to the film forming source gas, a cleaning gas for cleaning an inside of the processing chamber 101, a purge gas for substituting an atmosphere in the processing chamber 101, and the like can be supplied from the gas supply source 119 to the shower head 111 via the gas supply line 115 and the flow rate control unit 117.

The shower head 111 is connected to a high frequency power supply 123 via a matching unit 121. By supplying high frequency power from the high frequency power supply 123 to the shower head 111, a source gas supplied into the processing chamber 101 via the shower head 111 can be excited into plasma and a film forming process can be performed.

Formed in a bottom wall 101b of the processing chamber 101 is an exhaust port 131, which is connected to an exhaust device 135 via an exhaust line 133. By operating the exhaust device 135, the inside of the processing chamber 101 can be depressurized to a certain vacuum level.

In the film forming apparatus 200 configured as described above, the source gas is supplied from the shower head 111 to the wafer W while the heater 107 is heating the wafer W mounted on the susceptor 103, so that a thin film such as a Ti film or a TiN film can be formed on a surface of the wafer W by a CVD method. At this time, high frequency power can be supplied from the high frequency power supply 123 to the shower head 111 in order to increase efficiency of a film forming reaction.

Each of end devices 201 (for example, the heater power supply 109, the flow rate control unit 117, the high frequency power supply 123, and the exhaust device 135) constituting the film forming apparatus 200 is controlled by a module controller (MC) 401 such that a predetermined process can be performed in the processing chamber 101 as described later.

Referring back to FIG. 1, in the vacuum transfer chamber 3 which can be evacuated, there is provided a transfer mechanism 9 as a first substrate transfer mechanism for transferring the wafer W into the processing chambers 1a to 1d or the load lock chambers 5a and 5b. The transfer mechanism 9 includes a pair of transfer arms 11a and 11b arranged to face each other. Each of the transfer arms 11a and 11b is configured to be extensible and rotatable on the same rotation axis. Further, forks 13a and 13b for mounting and holding the wafer W are provided at front ends of the transfer arms 11a and 11b, respectively. The transfer mechanism 9 transfers the wafer W between the processing chambers 1a to 1d or between the processing chambers 1a to 1d and the load lock chambers 5a and 5b with the wafer W mounted on the fork 13a or 13b.

Mounting tables 6a and 6b for mounting the wafer W are provided in the load lock chambers 5a and 5b, respectively. The load lock chambers 5a and 5b are configured to be switched between a vacuum state and an atmospheric state. The wafer W is transferred between the vacuum transfer chamber 3 and an atmospheric transfer chamber 19 (which will be described later) via the mounting table 6a or 6b of the load lock chamber 5a or 5b.

The loader unit 7 includes the atmospheric transfer chamber 19 in which a transfer mechanism 17 is provided as a second substrate transfer mechanism for transferring the wafer W; three load ports LP adjacent to the atmospheric transfer chamber 19; and an orienter 21, adjacent to another side of the atmospheric transfer chamber 19, which serves as a position measurement device for measuring a position of the wafer W.

The atmospheric transfer chamber 19 includes a circulation system (not illustrated) for circulating, for example, a nitrogen gas or clean air, and a guide rail 23 installed in its longitudinal direction and has a rectangular cross section when viewed from the top. The transfer mechanism 17 is slidably supported by this guide rail 23. That is, the transfer mechanism 17 is configured to be movable in an X direction along the guide rail 23 by a non-illustrated driving mechanism. The transfer mechanism 17 includes a pair of transfer arms 25a and 25b arranged at two heights. Each of the transfer arms 25a and 25b is configured to be extensible and rotatable. Further, forks 27a and 27b for mounting and holding the wafer W are provided at front ends of the transfer arms 25a and 25b, respectively. The transfer mechanism 17 transfers the wafer W between wafer cassettes CR of the load ports LP, the load lock chambers 5a and 5b, and the orienter 21 with the wafer W mounted on the fork 27a or 27b.

The load port LP is configured to mount the wafer cassette CR thereon. The wafer cassette CR is configured to accommodate a plurality of wafers W therein at multiple heights and the same interval.

The orienter 21 includes a rotation plate 33 configured to be rotated by a non-illustrated driving motor and an optical sensor 35, positioned at an outer periphery of the rotation plate 33, for detecting a peripheral portion of the wafer W.

Figure 3:
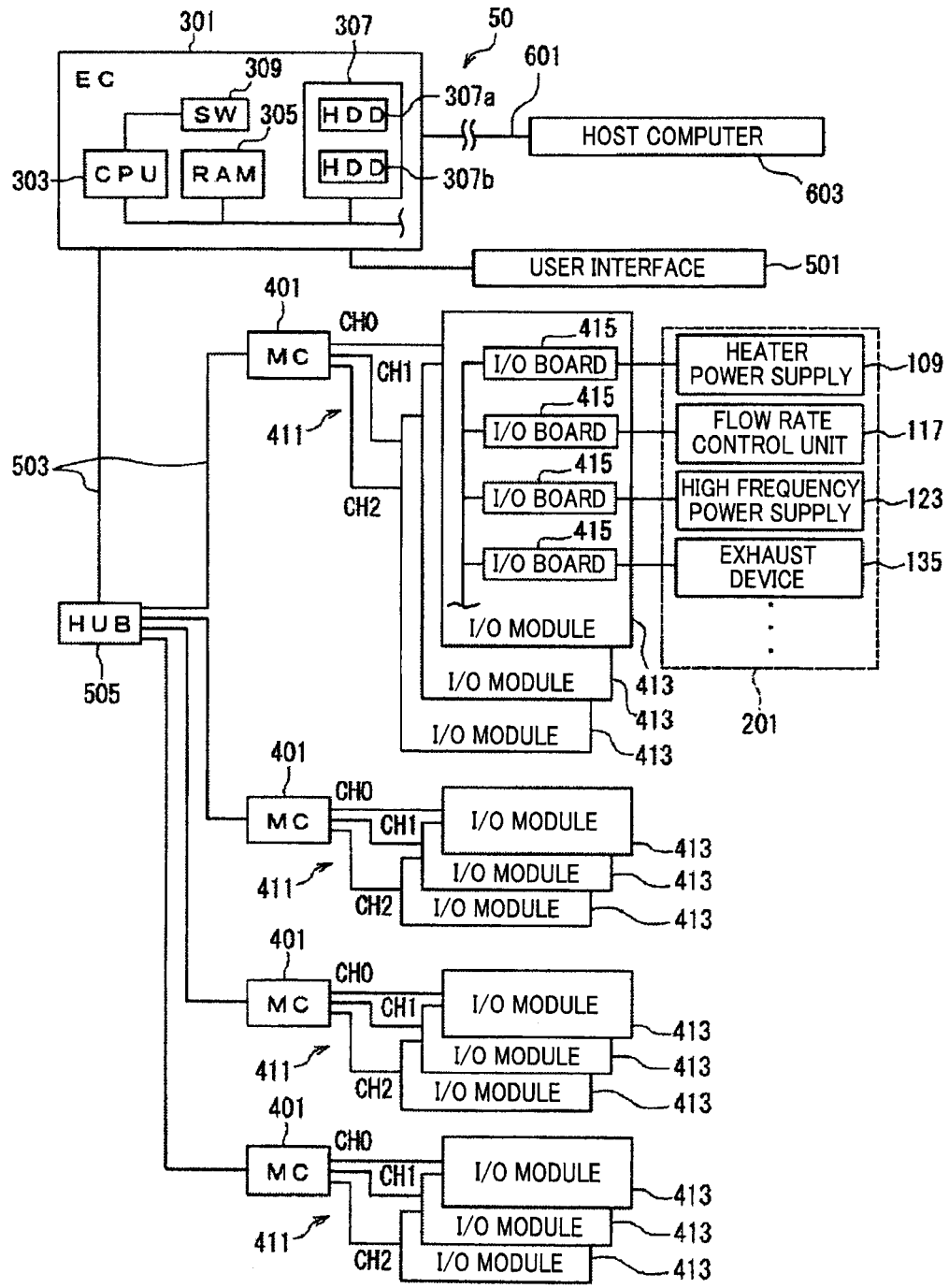
FIG. 3 shows a schematic configuration of a controller in the substrate processing system.

FIG. 3 shows a schematic configuration of a control system in the substrate processing system 100. The entire substrate processing system 100 or each of components constituting the processing chambers 1a to 1d as process ships, i.e., the end devices 201, is controlled by a controller 50. In this case, the end devices 201 may include, for example, the heater power supply 109, the flow rate control unit 117 having the MFC 117a or the valve (not illustrated), the high frequency power supply 123, and the exhaust device 135 in the film forming apparatus 200 illustrated in FIG. 2.

As depicted in FIG. 3, the controller 50 includes four MCs 401, as "first controllers", corresponding to the respective processing chambers 1a to 1d, an EC (Equipment Controller) 301, as "a second controller", for controlling the entire substrate processing system 100, and a user interface 501 connected to the EC 301. Further, the MCs 401 may be provided to, for example, the load lock chambers 5a and 5b or the loader unit 7 as well as the processing chambers 1a to 1d and they may be also controlled by the EC 301, but illustration and explanation thereof are omitted herein.

The EC 301 and the respective MCs 401 are connected with each other through a LAN (Local Area Network) 503 in a system. The LAN 503 in the system includes a switching HUB 505. The switching HUB 505 switches the MCs 401 as connection destinations of the EC 301 in response to a control signal of the EC 301.

The EC 301 is an integrated controller that controls operations of the entire substrate processing system 100 by controlling the respective MCs 401. The EC 301 includes a CPU (Central Processing Unit) 303, a RAM 305 as a volatile memory, a hard disc device 307 as a storage unit, and a switch (SW) 309. The CPU 303, the RAM 305, and the hard disc device 307 are connected to one another through a signal line such as a bus.

The hard disc device 307 includes a pair of HDDs 307a and 307b of the same configuration and is configured as RAID (Redundant Arrays of Independent Disk). If both of the HDDs 307a and 307b are connected to the hard disc device 307, the same contents are stored (mirrored) simultaneously in the HDDs 307a and 307b. Each of the HDDs 307a and 307b is detachably installed so as to perform a software version-up process after either one of them is disconnected (i.e., connection to the CPU 303 is shut down). The switch 309 is configured to turn on/off the EC 301 in response to, for example, an instruction inputted from the user interface 501.

Further, the EC 301 is connected, via a LAN 601, to a host computer 603 as an MES (Manufacturing Execution System) that manages manufacturing processes of the entire factory in which the substrate processing system 100 is installed. The host computer 603 is configured to send real-time information on various kinds of processes in the factory as a feedback signal to a main operation system (omitted from illustration) in cooperation with the controller 50 and make a decision about the processes in consideration of load conditions of the entire factory.

Furthermore, the EC 301 is connected to the user interface 501. The user interface 501 includes a keyboard or a touch panel through which a process manager inputs commands to manage the substrate processing system 100, a display for visualizing and displaying an operation status of the substrate processing system 100, a mechanical switch for giving an instruction to the switch 309 of the EC 301, and the like.

In the EC 301, the CPU 303 reads a program (software) including a recipe of a processing method of a wafer W selected by a user through the user interface 501 from any one HDD 307a or 307b of the hard disc device 307. Then, the program is transmitted from the EC 301 to each MC 401 and, thus, processes in the processing chambers 1a to 1d are controlled.

Figure 4:
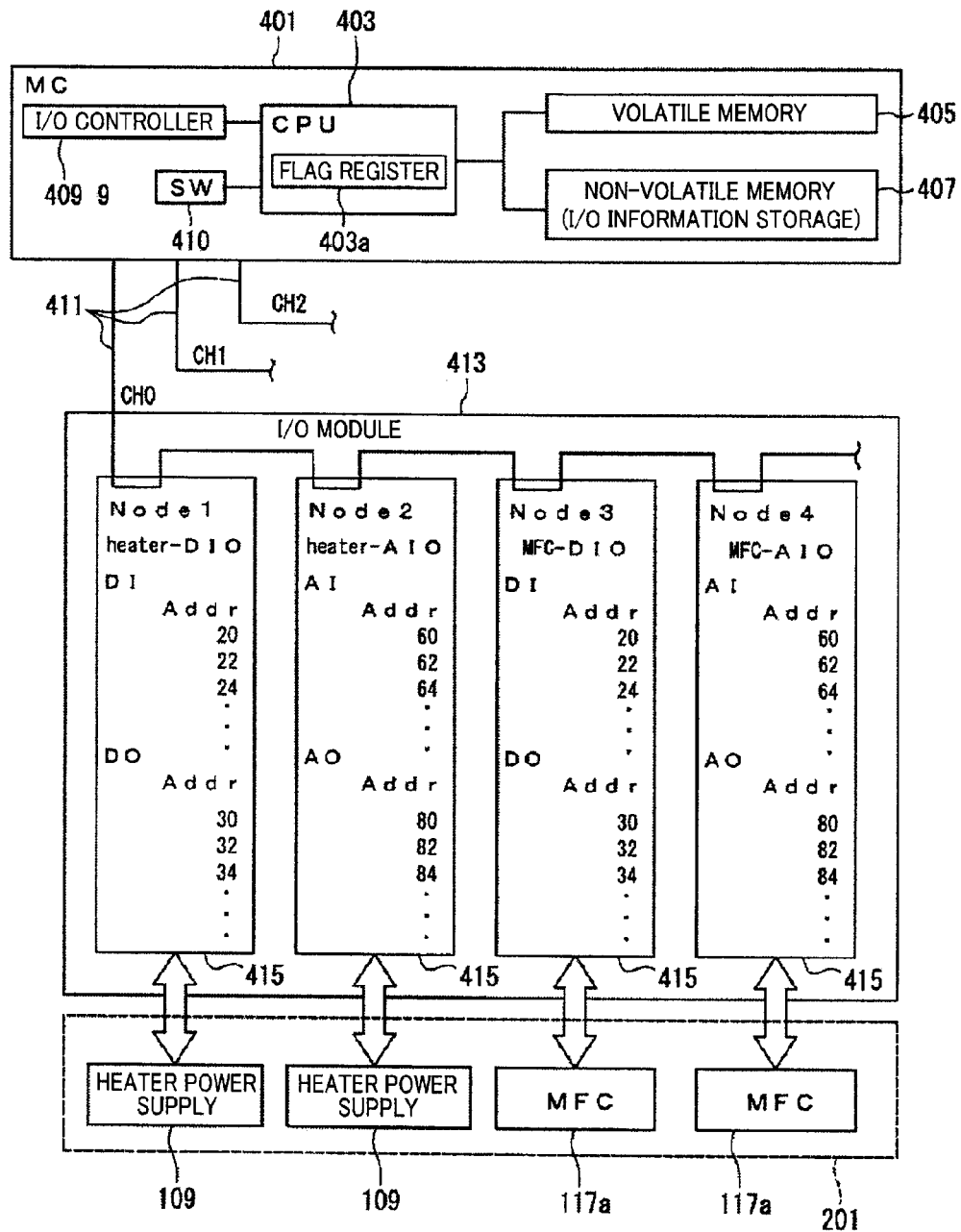
FIG. 4 is an explanatory diagram of a Module Controller (MC) and an I/O module in a controller.

The MC 401 is an individual controller for controlling an operation of each of the processing chambers 1a to 1d. As depicted in FIG. 4, the MC 401 includes a CPU 403, a volatile memory 405 such as a RAM, a non-volatile memory 407 serving as an I/O information storage, an I/O controller 409, and a switch (SW) 410. Provided in the CPU 403 is a flag register 403a configured to store flag information indicating that "power supply of the EC 301 is shut down while the end device 201 is being kept on standby" as described below. Further, the above-described flag register 403a may be provided in the non-volatile memory 407 of the MC 401, which is described later, instead of the CPU 403 or in the EC 301 instead of the MC 401.

The non-volatile memory 407 of the MC 401 includes non-volatile memories such as an SRAM, an MRAM, an EEPROM, or a flash memory. The non-volatile memory 407 stores therein various kinds of history information of the respective processing chambers 1a to 1d, i.e., an exchange time of the heater 107 in the susceptor 103 or an operation time of the exhaust device 135. Further, the non-volatile memory 407 serves as an I/O information storage and is configured to frequently write and store various kinds of I/O information (particularly, digital output information DO and analogue output information AO) exchanged between the MC 401 and the respective end devices 201 as described below.

The I/O controller 409 of the MC 401 transmits various control signals to an I/O module 413 which will be described later or receives signals such as status information of the respective end devices 201 from the I/O module 413. The switch 410 turns on/off the MC 401 in response to, e.g., a command of the EC 301.

The MC 401 controls the respective end devices 201 via the I/O (input/output) module 413. That is, the I/O module 413 transmits control signals to the respective end devices 201 and receives input signals from the end devices 201. Each MC 401 is connected to each I/O module 413 via a network 411. The network 411 connected to each MC 401 includes multiple channels such as channels CH0, CH1, and CH2.

The I/O module 413 includes a multiple number of I/O boards (although only four for each I/O module are shown) connected to the respective end devices 201 constituting the processing chambers 1a to 1d. These I/O boards 415 controls input/output of digital signals, analogue signals, and serial signals in the I/O module 413. FIGS. 3 and 4 show connection between a part of the end devices 201 and the I/O boards 415 for the simplicity of explanation.

Input/output information managed by the I/O boards 415 includes four kinds of information, i.e., digital input information DI, digital output information DO, analogue input information AI, and analogue output information AO. The digital input information DI is digital information inputted from the respective end devices 201 in a lower level of the control system to the MC 401 in an upper level of the control system. The digital output information DO is digital information outputted from the MC 401 in the upper level of the control system to the respective end devices 201 in the lower level of the control system. The analogue input information AI is analogue information inputted from the respective end devices 201 to the MC 401. The analogue output information AO is analogue information outputted from the MC 401 to the respective end devices 201.

The digital input information DI and the analogue input information AI include, for example, status information on the respective end devices 201. The digital output information DO and the analogue output information AO include, for example, commands regarding setting process conditions for the respective end devices 201. Further, the digital information may include, for example, on/off of the heater power supply 109, opening/closing of a valve (not illustrated) of the flow rate control unit 117, on/off of the high frequency power supply 123, on/off of the exhaust device 135 or opening/closing of a valve (not illustrated) of an exhaust system. Furthermore, the analogue information may include, for example, a setting temperature of the heater 107 and a setting flow rate at the MFC 117a of the flow rate control unit 117.

The four kinds of input/output information DI, DO, AI, and AO are classified by a plurality of I/O addresses corresponding to respective contents. Each I/O address includes, for example, 16-bit (0 to 15) digital information or analogue information. The analogue information is represented by, for example, hexadecimal number ranging from to FFF. Further, each I/O address is assigned an I/O address number Addr represent by double digits.

As described above, the network 411 connected to each MC 401 includes a multiple number of channels (for example, CH0, CH1, CH2 . . . ). Further, as depicted in FIG. 4, each I/O board 415 is assigned a node number Node represented by a number starting from 1. Therefore, the I/O addresses of the four kinds of input/output information DI, DO, AI, and AO can be specified by three kinds of parameters, i.e., a channel number, the node number Node ranging from 1 to n (n is integer), and the I/O address number Addr represented by double digits.

For example, FIG. 4 illustrates some I/O address numbers Addr of heater-DIO, which is digital input/output information of the heater 107; heater-AIO, which is analogue input/output information of the heater 107; MFC-DIO, which is digital input/output information of the MFC 117a; and MFC-AIO, which is analogue input/output information of the MFC 117a. For example, at an I/O address specified by CH0, Node 1, and Addr 30 in FIG. 4, digital output information DO regarding on/off of the heater power supply 109 may be specified. Further, for example, at an I/O address specified by CH0, Node 4, and Addr 80, analogue output information AO regarding a setting flow rate of the MFC 117a may be specified. Detailed illustration and description of the respective input/output information will be omitted herein.

Figure 5:
FIG. 5 is an example table showing a corresponding relationship between an I/O address and an I/O management number.

In the present embodiment, the I/O address is assigned a unique I/O management number corresponding thereto. FIG. 5 is an example table T showing a corresponding relationship between an I/O address and an I/O management number. The I/O address may be changed when, for example, the version-up of software for controlling the substrate processing system 100 is made. Such change is made when, for example, the end device 201 which is a target to be controlled by the MC 401, or control content (process condition or the like) thereof is added or changed. Meanwhile, the I/O management number is assigned as a unique number which is not changed, although the software is changed through a version-up or the like. Therefore, although the I/O address is changed through a software version-up or the like, the I/O address before and after the version-up can be easily compared and checked by using the I/O management number. The table T illustrated in FIG. 5 is stored in the HDD 307a (307b) of the EC 301 together with the software and loaded into the volatile memory 405 when the MC 401 is started, for example.

With respect to the digital output information DO and the analogue output information AO, initial values to be outputted to the respective end devices 201 and the respective I/O management numbers corresponding thereto are stored in the software.

Further, the non-volatile memory 407 serving as an I/O information storage of the MC 401 stores therein the I/O information (particularly, the digital output information DO and the analogue output information AO) on the respective end devices 201 and the respective I/O management numbers corresponding thereto. Therefore, although the I/O information is added or deleted through the version-up or the like, the I/O information of the respective end devices 201 can be accurately retrieved by using the I/O management numbers.

Figure 6:
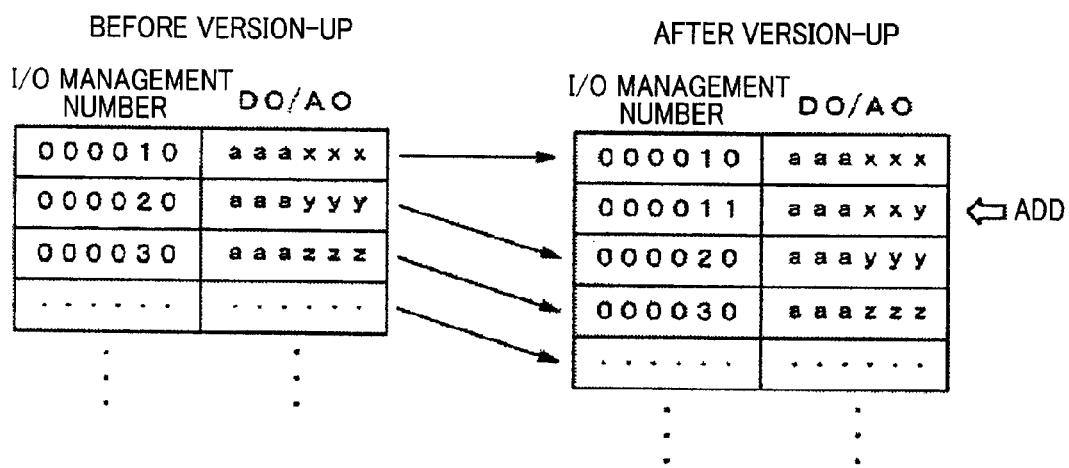
FIG. 6 shows a corresponding relationship between I/O information and an I/O management number.

For example, FIG. 6 shows a corresponding relationship between an I/O management number and digital output information DO (or analogue output information AO) in case where "aaaxxy" which did not exist before a software version-up is added as I/O information through the software version-up. In this case, the added I/O information "aaaxxy" is assigned "000011" as its corresponding I/O management number. This I/O management number "000011" did not exist before the version-up. Therefore, after the version-up, as the digital output information DO (or the analogue output information AO), an initial value of "aaaxxy" stored in software is outputted from the MC 401. On the other hand, as for the other I/O information such as "aaaxxx," digital output information DO (or analogue output information AO) stored in the non-volatile memory 407 is retrieved with reference to the corresponding I/O management number, and, thus, after the version-up, digital output information DO (or analogue output information AO) corresponding thereto can be outputted again from the MC 401.

In the controller 50 configured as stated above, the I/O boards 415 connected to a multiple number of end devices 201 are modularized to constitute the I/O module 413, and the I/O module 413 is connected to the EC 301 via the MC 401 and the switching HUB 505. Since the end devices 201 are not directly connected to the EC 301 but connected thereto via the I/O module 413 and the MC 401, a hierarchical control system can be achieved.

Hereinafter, there will be explained a software version-up process in the EC 301 of the substrate processing system 100 configured as stated above. As described above, the hard disc device 307 of the EC 301 includes a pair of HDDs 307a and 307b of the same configuration. In order to perform the version-up of software recorded in the HDDs 307a and 307b, one of the HDDs 307a and 307b is disconnected and then new software is installed. Here, in order to disconnect one of HDDs 307a and 307b, power supply of the EC 301 needs to be shut down in consideration of a configuration of the hard disc device 307.

In a conventional substrate processing system, when the EC 301 for generally controlling the entire system is shut down, the operations of all the end devices 201 need be stopped for safety purpose. However, in the substrate processing system for performing an accurate process such as a film forming process or an etching process on the wafer W, there is a problem in that if the respective end devices 201 are stopped once, temperatures or pressures in the processing chambers 1a to 1d are changed and, thus, conditions in the processing chambers 1a to 1d may be changed. Thereafter, in order to recover the conditions in the processing chambers 1a to 1d to operable conditions, preparatory processes such as a process of cleaning or purging the inside of the processing chambers 1a to 1d, a process of preliminarily heating the susceptor 103, and a process of pre-coating the susceptor 103 are needed to be performed. Accordingly, downtime of the whole substrate processing system is increased, which causes a decrease in process efficiency.

Figure 7:
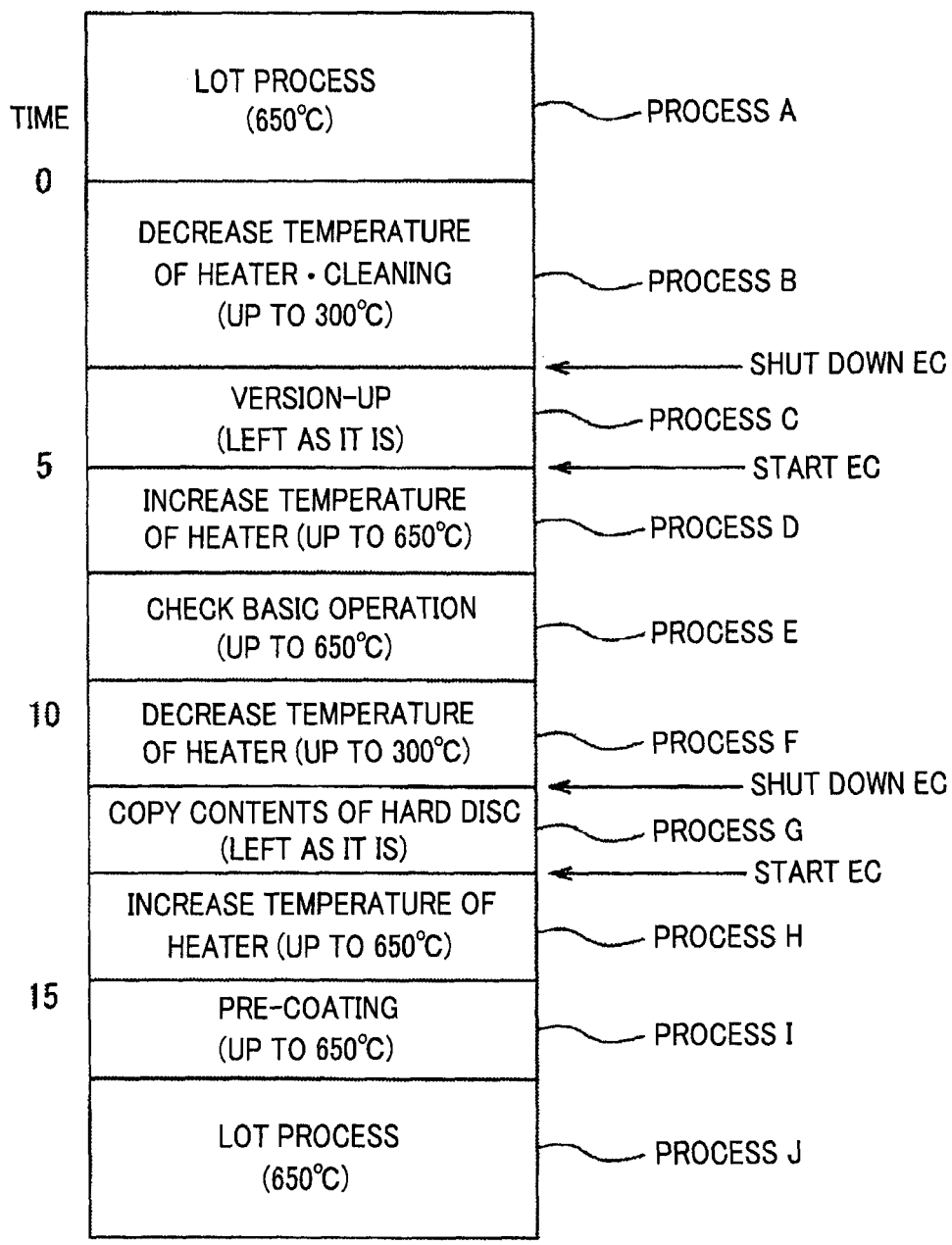
FIG. 7 is an example of a software version-up process in accordance with a conventional method.

Hereinafter, referring to FIG. 7, there will be explained a sequence of a software version-up process in accordance with a conventional method in the substrate processing system 100. FIG. 7 shows a sequence of a software version-up process of the EC 301 in accordance with the conventional method in the substrate processing system 100 together with an example of a processing time and changes in a setting temperature of the susceptor 103.

First, in a state where a common lot process is being performed on the wafer W (process A), the temperature of the susceptor 103 is decreased to about 300°C. by reducing an output of the heater 107 and the inside of the processing chamber is cleaned by a $ClF_3$ gas or the like (process B). Then, the EC 301 is turned off and, for example, one HDD 307b is disconnected and the version-up of software stored in the other HDD 307a is made through an external memory (process C). The software version-up may include installation of new software, a copy of a patch file or the like. Further, in the following description, the version-up software may be referred to as "new software."

Power supply of the EC 301 may be turned off (shut down) through, e.g., the user interface 501. In this case, since the EC 301 is turned off, a power supply of the MC 401 or the end devices 201 of the respective processing chambers 1a to 1d also becomes shut down (stopped). At this time, since the heater power supply 109 is shut down, the temperature of the susceptor 103 is left as it is.

Subsequently, power supply of the EC 301 is turned on and the temperature of the susceptor 103 is increased to a predetermined temperature (e.g., about 650° C.) by gradually increasing an output to the heater 107 from the heater power supply 109 (process D), and a basic operation of new software is checked (process E). After the operation check is normally completed, the temperature of the susceptor 103 is decreased to about 300° C. by reducing the output to the heater 107 (process F). Then, power supply of the EC 301 is turned off again and the HDD 307b is connected to the EC 301, and contents (including the new software) of the HDD 307a are copied into the HDD 307b (process G). At this time, since the heater power supply 109 is shut down, the temperature of the susceptor 103 is left as it is.

Subsequently, the EC 301 is turned on again and the temperature of the susceptor 103 is increased to a predetermined temperature (e.g., about 650° C.) by gradually increasing the output of the heater 107 (process H), and a pre-coating process is performed on the susceptor 103 (process I). Through the above-described processes B to I, the conditions in the processing chamber are recovered to the operable conditions. Thereafter, the lot process of the wafer W is restarted (process J).

It takes time to perform the above-described processes B to I because temperature of the susceptor 103 needs to be increased or decreased. To be specific, it may take about fifteen hours or more to complete the software version-up.

For this reason, in the present embodiment, even if the EC 301 is shut down, the respective end devices 201 of the processing chambers 1a to 1d are kept in a standby state (in an idle state). That is, if the EC 301 is shut down, the substrate processing system 100 is configured to select (control) one of a system shutdown state in which all the end devices 201 of the processing chambers 1a to 1d as well as the EC 301 and the MC 401 are stopped and a standby state in which the EC 301 and the MC 401 are stopped but some or all of the end devices 201 of the processing chambers 1a to 1d are ready to perform a process on the wafer W. If the standby state is selected, all the end devices 201 may be kept in the standby state, or only some of the end devices 201 such as the heater 107 and the heater power supply 109 may be kept in the standby state but the other end devices 201 are stopped.

For example, the process manager can select the system shutdown state or the standby state through a display of the user interface 501. If a command of selecting the system shutdown state is inputted through the user interface 501, the EC 301 transmits, to the MC 401, a command to shut the system down. Upon receiving it, the MC 401 transmits, to the respective end devices 201, digital output information DO for instructing the respective end devices 201 to be in the system shutdown state via the I/O boards 415 of the I/O module 413. Then, the respective end devices 201 are controlled to be in the system shutdown state and status information (digital input information DI) indicating the shutdown state is transmitted to the MC 401. Based on the digital input information DI, it is checked that the respective end devices 201 are stopped. Then, the MC 401 is shut down by the switch 410 thereof. After shutdown of the MC 401 and the respective end devices 201 is performed (checked), the EC 301 is shut down by the switch 309 thereof. In this way, the whole substrate processing system 100 can be stopped.

Meanwhile, if a command of a process for keeping the end devices 201 in the standby state and shutting the EC 301 down (hereinafter, referred to as "hot shutdown process") is inputted through the user interface 501, a sequence of the following processes is performed by the controller 50.

Figure 8:
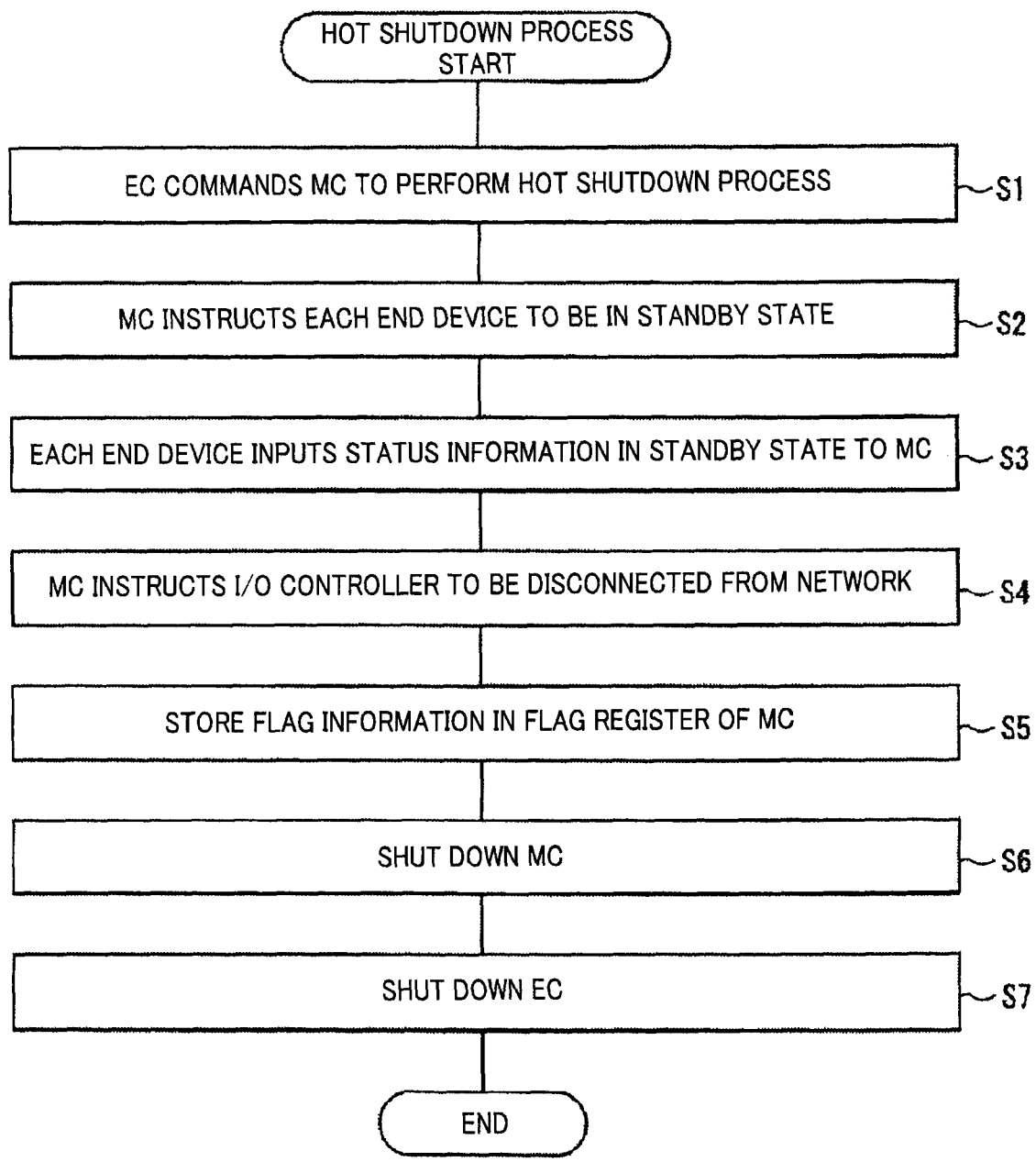
FIG. 8 is a flowchart showing an example of a sequence of a hot shutdown process.

FIG. 8 shows an example of a sequence of the hot shutdown process performed by the controller 50. If a command of the hot shutdown process is inputted through the user interface 501, the EC 301 transmits a command of the hot shutdown to the MC 401 in step S1. Upon receiving it, the MC 401 outputs, to the respective end devices 201, digital output information DO for instructing the respective end devices 201 to be in the standby state via the I/O boards 415 of the I/O module 413 in step S2.

Then, status information is transmitted (inputted) from the respective end devices 201 to the MC 401 via the I/O boards 415 of the I/O module 413 in step S3. Based on such digital information DI and analogue input information AI, it can be checked that a state of each end device 201 is changed to the standby state.

If it is checked that a state of each end device 201 is changed to the standby state, the CPU 403 of the MC 401 instructs the I/O controller 409 to be disconnected from the network 411 in step S4. The respective end devices 201 are kept in the current state (i.e., in the standby state) until the network is connected again. At this time, I/O information (particularly, digital output information DO and analogue output information AO) of the respective end devices 201 of the processing chambers 1a to 1d in the standby state is recorded in the non-volatile memory 407 serving as an I/O information storage of the MC 401. The I/O information of the respective end devices 201 in the standby state varies depending on contents (conditions) of a prior process.

Subsequently, in step S5, the flag register 403a of the CPU 403 of the MC 401 stores therein flag information indicating that the hot shutdown process is selected. The reason for storing the flag information is that when the EC 301 and the MC 401 is restarted next time, it needs to recognize that the respective end devices 201 are in the standby state.

Then, in step S6, the MC 401 is shut down by the switch 410 thereof. After the MC 401 is shut down, the EC 301 is shut down by the switch 309 thereof in step S7.

As described above, in the hot shutdown process, the EC 301 and the MC 401 are shut down but the respective end devices 201 of the processing chambers 1a to 1d are kept in the standby state. The shutdown of the EC 301 by the hot shutdown process may include a short-term shutdown for a restart.

The hot shutdown process can be selected only when the respective end devices 201 of the processing chambers 1a to 1d are allowed to be in the standby state (including an idle state between the lot processes of the wafer W). Accordingly, for example, when a cleaning process, a purging process, or a pre-coating process is being performed in the processing chambers 1a to 1d, when pressure in one of the processing chambers 1a to 1d is being adjusted to atmospheric pressure, when a high voltage is being applied from the high frequency power supply 123 to the shower head 111, or when the temperature of the heater 107 is on the increase, such a state is recognized as an error and the hot shutdown process is stopped. In this case, for example, a warning alarm is given.

The hot shutdown process is ended through the above steps S1 to S7. Each process in steps S1 to S7 is carried out according to, for example, the software stored in the HDD 307a or 307b of the EC 301. In this way, performed is the hot shutdown process in which the EC 301 and the MC 401 are stopped but the respective end devices 201 of the substrate processing system 100 are kept in the standby state.

In accordance with the substrate processing system 100 of the present embodiment, preparatory processes (for example, processes B, D, F, H, and I) may be unnecessary before and after the software version-up by performing the hot shutdown process as described above.

Hereinafter, there will be explained an example of a sequence of processes performed by the controller 50 when the EC 301 is started, with reference to FIG. 9. First, the switch 309 is turned on through the user interface 501, and, thus, a starting process of the EC 301 (a start-up of the substrate processing system 100) is performed. In step S11, the MC 401 is reset for downloading new version-up software. Then, in step S12, software for a process on the wafer W is loaded from the EC 301 to the MC 401. If the version-up of software is made before the EC 301 is started, new software may be loaded in step S12.

Subsequently, in step S13, it is checked whether or not flag information indicating that the last shutdown was performed by a hot shutdown process exists in the flag register 403a of the CPU 403 of the MC 401. As a result of the check in step S13, if the flag information exists (Yes), the CPU 403 of the MC 401 refers to the I/O information (particularly, digital output information DO and analogue output information AO) on the respective end devices 201 stored in the non-volatile memory 407 in step S14. In this step, the MC 401 may obtain new digital input information DI and analogue input information AI as status information from the respective end devices 201. However, in consideration of a configuration of the control system, output information DO and AO and input information DI and AI are not necessarily in one-to-one corresponding relationship. Therefore, it is certainly advantageous to store the digital output information DO and the analogue output information AO outputted last time in the non-volatile memory 407 and retrieve them from the non-volatile memory 407.

In step S15, the MC 401 instructs the I/O controller 409 to be connected to the network 411 based on the software loaded from the EC 301 and then outputs, to the respective end devices 201, I/O information (particularly, digital output information DO and analogue output information AO) on the respective end devices 201 related to the previous processes performed in the respective processing chambers 1a to 1d before being started. Based on the output, a status of the respective end devices 201 in the standby state under the same condition as the last process can be compatible with a control signal from the MC 401 to the respective end devices. At this time, although the I/O address is changed through, e.g., a software version-up, it is accurately and easily possible to specify the I/O information with reference to the I/O management numbers (see FIGS. 5 and 6). Therefore, even if the I/O address is changed by the new version-up software, the MC 401 can accurately transmit, to the respective end devices 201, the same I/O information as a previous process, particularly the digital output information DO and the analogue output information AO serving as a control signal by using the I/O control numbers.

Thereafter, in step S16, by the software loaded from the EC 301 to the MC 401, the EC 301 is synchronized with the MC 401 and both controllers are connected to each other. In this way, the start-up of the substrate processing system 100 can be completed. Accordingly, after step S16, processes of the same contents as a previous process can be continuously performed in the respective processing chambers 1a to 1d. If the version-up of the software is made before the EC 301 is started, operations check and a backup for new software can be performed after step S16.

Meanwhile, as a result of the check in step S13, if the flag information does not exist (No), the substrate processing system 100 is started from a complete shutdown state. In this case, the processes performed in step S14 and step S15 are not necessary, and initial values of the digital output information DO and analogue output information AO are outputted (step S15') after step S13. Then, in step S16, the start-up of the substrate processing system 100 can be completed by synchronizing the EC 301 with the MC 401. In this case, since the substrate processing system 100 is started from the complete shutdown state, preparatory processes (e.g., a process of controlling a temperature of the susceptor 103 and a process of pre-coating the susceptor 103) in the respective processing chambers 1a to 1d are needed prior to a lot process on the wafer W. This lot process may be the same as or different from a lot process performed before the start-up of the EC 301.

By starting the EC 301 through the above-described steps S11 to S16, although the last process is a hot shutdown process, it is possible to start the EC 301 without disturbing the control system. Further, the processes of step S11 to step S16 are performed by the software stored in, for example, the HDD 307a or 307b of the EC 301. This software may be new software when a software version-up is performed or other different software.

Figure 9:
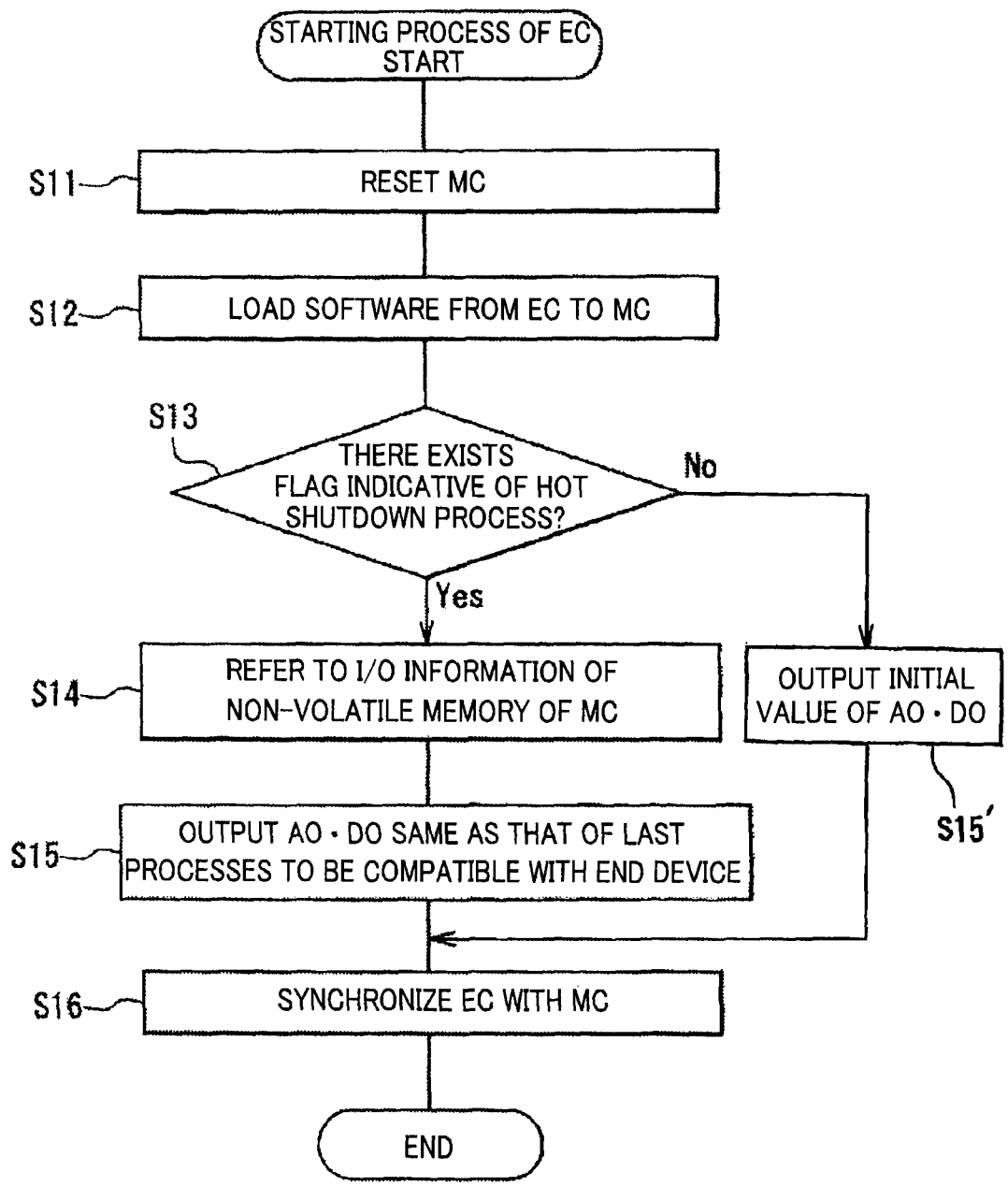
FIG. 9 is a flowchart showing an example of a sequence of a starting process of an EC.
Figure 10:
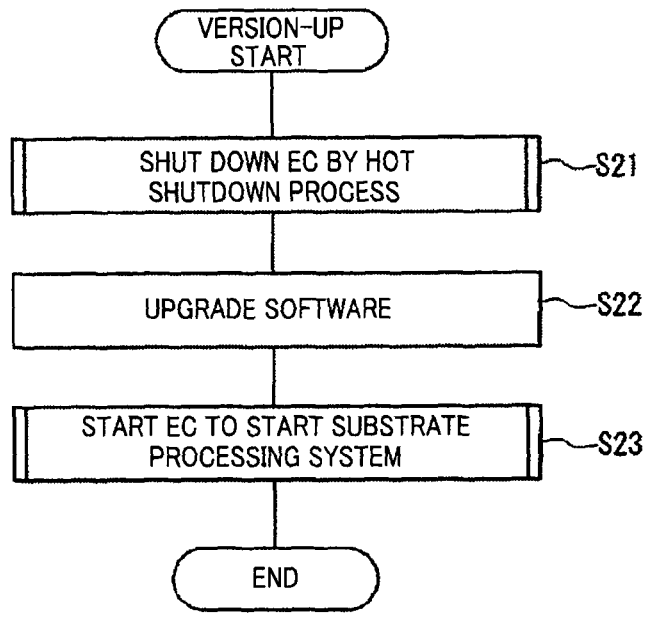
FIG. 10 is a flowchart showing an example of a sequence of a software version-up process.

FIG. 10 is a flowchart showing an example of a sequence of software version-up processes using a hot shutdown process of steps S1 to S7 illustrated in FIG. 8 and a starting process of the EC 301 of steps S11 to S16 illustrated in FIG. 9.

In step S21 of FIG. 10, the EC 301 is first shut down by a hot shutdown process. The hot shutdown process can be performed in the same manner as steps S1 to S7 illustrated in FIG. 8.

Then, in step S22, the version-up of software is performed. For example, while one HDD 307b is disconnected from the hard disc device 307 of the EC 301, the version-up of the software may be made in the other HDD 307a by using an external memory. In the meantime, the respective end devices 201 are kept in a standby state.

Subsequently, in step S23, the substrate processing system 100 is started by starting the EC 301. The EC 301 can be started in the same sequence of steps S11 to S16 illustrated in FIG. 9. After the EC 301 is started in step S23, preparatory processes for controlling conditions of the respective processing chambers 1a to 1d are not necessary. Accordingly, a lot process on the wafer W can be promptly started under the control of the version-up software.

Figure 11:
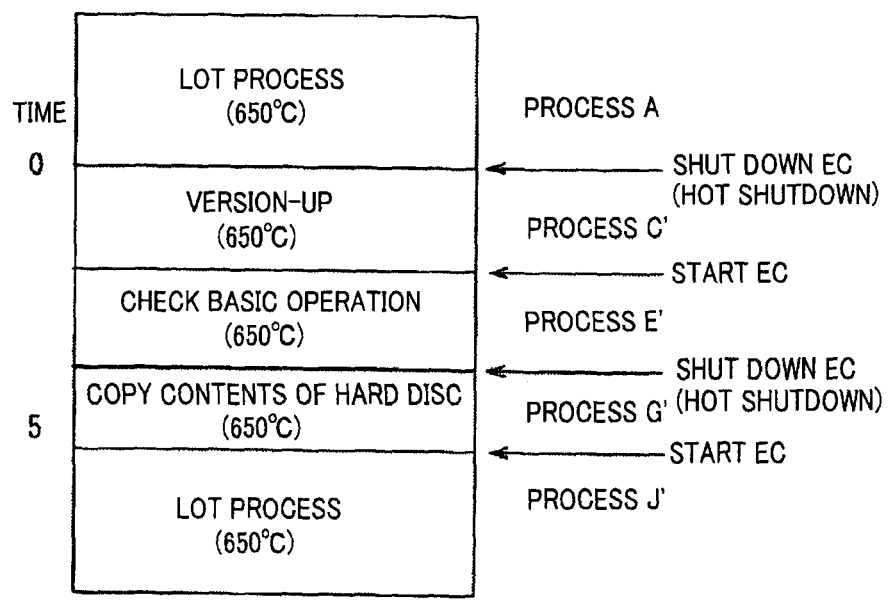
FIG. 11 is an example of a software version-up process using a hot shutdown process.

Through the above-described steps S21 to S23, it is possible to greatly reduce downtime of the substrate processing system 100 which is required for the software version-up. In this regard, there will be explained a software version-up process with reference to FIG. 11. FIG. 11 is an example of a software version-up process using a hot shutdown process. To be more specific, FIG. 11 shows an example of a sequence of processes, a change in a setting temperature of the susceptor 103, and a processing time when the version-up of software of the EC 301 is performed by a hot shutdown process between lot processes on the wafer W. The effect of the present invention can be understood clearly by comparing FIG. 11 with FIG. 7 showing a software version-up in accordance with a conventional method.

As depicted in FIG. 11, in a state where a common lot process is being performed on the wafer W (process A), the EC 301 is shut down by a hot shutdown process and then the version-up of the software is made (process C'). In the meantime, the hot shutdown process is selected and thus the respective end devices 201 of the processing chambers 1a to 1d can be kept in a standby state. For example, the susceptor 103 may be maintained at a temperature of about 650° C.

Then, the substrate processing system 100 is started by starting the EC 301 according to the sequence as illustrated in FIG. 9. After the EC 301 is started, a basic operation of new software is checked (process E'). In this case, during the version-up of software in process C', the susceptor 103 can be maintained at the temperature of about 650° C. by the hot shutdown process. For this reason, the process E' can be performed at the same temperature right after the process C'.

Subsequently, in a process G', the EC 301 is shut down again by a hot shutdown process and contents (including software) of the HDD 307a are copied into the other HDD 307b for a backup (process G'). During this process G', since the hot shutdown process is selected, the susceptor 103 can be maintained at the temperature of about 650° C.

Thereafter, the substrate processing system 100 is started again by starting the EC 301 according to the sequence as illustrated in FIG. 9 in order to perform a lot process (process J'). In this case, during the process G', since a hot shutdown process is selected, the susceptor 103 can be maintained at the temperature of about 650° C. For this reason, the lot process (process J') can be performed at the same temperature right after the process G'.

It can be seen by comparison between FIG. 7 and FIG. 11 that the processes B, D, F, H, and I of FIG. 7 bringing a change of temperature such as an increase or a decrease in temperature become unnecessary by the benefit of the hot shutdown process. That is, it can be found that downtime of the substrate processing system 100 which is required for a software version-up can be greatly reduced by the benefit of the hot shutdown process. Further, as shown in FIG. 11, if the same process is performed before and after the software version-up, the cleaning process (process B) and the pre-coating process (process I) become unnecessary. Furthermore, since a temperature of the heater 107 scarcely needs to be increased or decreased, it is remarkably advantageous in saving energy or reducing costs as compared to a conventional way.

As explained above, the substrate processing system 100 in accordance with the present embodiment is configured to select and control (perform) a hot shutdown process which maintains the respective end devices 201 of the processing chambers 1a to 1d in a standby state (idle state) even if the EC 301 serving as a main computer needs to be shut down for, e.g., a software version-up. For this reason, when the EC 301 is started subsequently, preparatory processes become unnecessary in the processing chambers 1a to 1d or the required preparatory processes can be minimized. Therefore, downtime of the substrate processing system 100 can be greatly reduced. Further, it is possible to save energy and reduce costs in the substrate processing system 100.

Although there has been described an embodiment of the present invention, the present invention is not limited to the above-described embodiment and can be modified in various ways. For example, although there has been described a case where the EC 301 is shut down for a software version-up, the present invention can be applied to another case where the EC 301 is shut down for another purpose and the same effect as described above can be obtained.

Further, in the example of the software version-up process illustrated in FIG. 11, after the EC 301 is started, the basic operation is checked (process E') or contents of the hard disc are copied (process G'), but these processes may be omitted. That is, in accordance with the software version-up method of the present invention, a lot process same as previous process can be performed just by performing a hot shutdown process one time before the version-up process and by starting the EC 301 one time after the version-up process.

Furthermore, if a software version-up process is completed by simply copying a patch file, the EC 301 may be shut down and the patch file may be copied from an external memory without disconnecting one HDD 307b from the hard disc device 307 and then the EC 301 can be restarted through a hot shutdown process. The hard disc device 307 may not include a pair of the HDDs 307a and 307b and may include only one HDD (for example, HDD 307a).

In the above embodiment, both the EC 301 and the MC 401 are shut down by the hot shutdown process but only the EC 301 may be shut down.

Further, in the above embodiment, regardless of the hot shutdown process, the I/O information is written and stored in the non-volatile memory 407 of the MC 401 whenever contents of the processes performed in the processing chambers 1a to 1d are changed. However, the I/O information may be written in the non-volatile memory 407 of the MC 401 only when the hot shutdown process is selected.

Furthermore, in the above embodiment, there has been described the substrate processing system 100 including four processing chambers 1a to 1d each adjacent to the vacuum transfer chamber 3, but the present invention can be applied to a substrate processing system including a cluster tool of a different configuration or a single processing apparatus.

The processing system of the present invention is not limited to an apparatus for processing a semiconductor wafer but can be applied to a substrate processing apparatus for processing a large-sized glass substrate used for, e.g., a liquid crystal display or an organic EL display.

What is claimed is:

1. A processing system configured to perform a predetermined process on a target object, the processing system comprising:
one or more processing apparatuses that process the target object and include a susceptor configured to support the target object, a heater embedded in the susceptor, a heater power supply configured to supply power to the heater, and a multiple number of end devices;
a plurality of first controllers, each being provided in each of the processing apparatuses to control each of the processing apparatuses;
a second controller that is connected to the plurality of first controllers to generally control the first controllers; and
a network configured to connect the multiple number of end devices to the first controllers,
wherein the second controller controls the processing apparatuses, when the second controller is to be shut down, so as to select a standby state in which some or all of the end devices are ready to perform a process on the target object, the first controller includes an I/O information storage that stores I/O information on the end devices in the standby state, the first controller disconnects the network after storing control information of the heater power supply in the I/O information storage, the heater power supply is kept in the standby state to hold power supplied to the heater after the second controller has been shut down, if the second controller is restarted, the second controller loads software onto the first controller, and, according to the software, the first controller refers to the I/O information stored in the I/O information storage and outputs the same I/O information as a referred I/O information to each of the end devices, and a status of the heater power supply in the standby state becomes compatible with the control information of the heater power supply stored by the first controller by outputting the control information of the heater power supply stored in the I/O information storage to the heater power supply after connecting the first controller to the each of the end devices.

2. The processing system of claim 1, wherein the I/O information is assigned a unique management number.

3. The processing system of claim 1, wherein the target object is a semiconductor substrate.

4. The processing system of claim 1, wherein the predetermined process is a film forming process.

5. A control method configured to control a processing system when a version-up of software executed by a controller is performed, the processing system performing a predetermined process on a target object and including one or more processing apparatuses that process the target object and include a susceptor configured to support the target object, a heater embedded in the susceptor, a heater power supply configured to supply power to the heater, and a multiple number of end devices, the controller controlling the processing apparatuses, when the controller is to be shut down, so as to select a standby state in which some or all of the end devices are ready to perform a process on the target object, and a network configured to connect the multiple number of end devices to the controller, the control method comprising:

storing I/O information on the end devices in the standby state in an I/O information storage connected to the controller;

storing control information of the heater power supply in the I/O information storage;

disconnecting the controller from the network;

keeping the heater power supply in the standby state to hold power supplied to the heater after the controller has been shut down;

referring to the I/O information on the end devices in the standby state which is stored in the I/O information storage, when the controller is restarted after new software is installed in the controller;

outputting the same I/O information as a referred I/O information to each of the end devices; and outputting the control information of the heater power supply stored in the I/O information storage to the heater power supply after connecting the controller to the each of the end devices such that a status of the heater power supply in the standby state becomes compatible with the control information of the heater power supply stored in the I/O information storage.

6. The control method of claim 5, wherein the I/O information is assigned a unique management number.

7. The control method of claim 6, wherein the management number is commonly used in software before a version-up and new software after the version-up.

* * * * *